United States Patent
Yoon et al.

(10) Patent No.: US 10,948,137 B2
(45) Date of Patent: Mar. 16, 2021

(54) COLOR CONVERSION PANEL AND DISPLAY DEVICE INCLUDING COLOR CONVERSION PANEL

(71) Applicant: Samsung Display Co., Ltd., Yongin-Si (KR)

(72) Inventors: Seon-Tae Yoon, Seoul (KR); Jung Hyun Kwon, Seoul (KR); Ki Soo Park, Hwaseong-si (KR); Hae Il Park, Seoul (KR); Moon Jung Baek, Seoul (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 16/219,845

(22) Filed: Dec. 13, 2018

(65) Prior Publication Data
US 2019/0113186 A1    Apr. 18, 2019

Related U.S. Application Data

(63) Continuation of application No. 15/677,471, filed on Aug. 15, 2017, now Pat. No. 10,184,618.

(30) Foreign Application Priority Data

Jan. 19, 2017    (KR) .......... 10-2017-0009160

(51) Int. Cl.
*F21K 9/64*    (2016.01)
*H01L 33/50*    (2010.01)
(Continued)

(52) U.S. Cl.
CPC .............. *F21K 9/64* (2016.08); *F21V 9/40* (2018.02); *G02F 1/133606* (2013.01); *G02F 1/133617* (2013.01); *G02F 1/353* (2013.01); *H01L 33/50* (2013.01); *G02F 2202/36* (2013.01); *H01L 33/504* (2013.01)

(58) Field of Classification Search
None
See application file for complete search history.

(56) References Cited

U.S. PATENT DOCUMENTS 10,184,618 B2 *    1/2019    Yoon ................... F21V 9/40
2013/0146903 A1 *    6/2013    Ichikawa ............ H01L 27/3246
257/88

(Continued)

FOREIGN PATENT DOCUMENTS

KR    10-2010-0089606    8/2010
KR    10-2012-0088273    8/2012
(Continued)

*Primary Examiner* — Michelle Mandala
*Assistant Examiner* — Jordan M Klein
(74) *Attorney, Agent, or Firm* — Innovation Counsel LLP (57) ABSTRACT

A color conversion panel includes a first color conversion layer, a second color conversion layer, and a light wavelength conversion layer. The first color conversion layer includes a first semiconductor nanocrystal set for providing red light. The second color conversion layer neighbors the first color conversion layer and includes a second semiconductor nanocrystal set for providing first green light. The light wavelength conversion layer neighbors the second light conversion layer, may provide blue light, and includes a third semiconductor nanocrystal set for providing second green light.

16 Claims, 5 Drawing Sheets

(51) Int. Cl.
*G02F 1/35* (2006.01)
*F21V 9/40* (2018.01)
*G02F 1/13357* (2006.01)
*G02F 1/1335* (2006.01)

(56) References Cited

U.S. PATENT DOCUMENTS

| | | | | |
|---|---|---|---|---|
| 2013/0242228 A1* | 9/2013 | Park | ................ | G02F 1/133617 349/61 |
| 2014/0043566 A1* | 2/2014 | Lee | ................ | G02F 1/133617 349/71 |
| 2015/0077966 A1* | 3/2015 | Bessho | ................ | F21V 5/002 362/19 |
| 2015/0228232 A1* | 8/2015 | Lee | ................ | G02F 1/133617 345/88 |
| 2016/0195773 A1 | 7/2016 | Lee et al. | | |
| 2017/0236866 A1* | 8/2017 | Lee | ................ | H01L 27/156 257/89 |
| 2017/0286044 A1 | 10/2017 | Kim et al. | | |

FOREIGN PATENT DOCUMENTS

| | | |
|---|---|---|
| KR | 10-2016-0017373 | 2/2016 |
| KR | 10-1643300 | 8/2016 |

* cited by examiner

COLOR CONVERSION PANEL AND DISPLAY DEVICE INCLUDING COLOR CONVERSION PANEL

CROSS-REFERENCE TO RELATED APPLICATION

This application is a continuation application of U.S. patent application Ser. No. 15/677,471 filed Aug. 15, 2017, which claims priority to and the benefit of Korean Patent Application No. 10-2017-0009160, filed on Jan. 19, 2017, in the Korean Intellectual Property Office, the disclosure of which is incorporated herein in its entirety by reference.

BACKGROUND (a) Field

The technical field relates to a color conversion panel and a display device.

(b) Description of the Related Art

A display device, e.g., a liquid crystal display device, may include two field generating electrodes, a liquid crystal layer, a color filter, and a polarization layer overlapping one another. Light leakage may occur at/near the polarization layer and/or the color filter of the display device.

The above information disclosed in this Background section is for enhancement of understanding of the application. This Background section may contain information that does not form the prior art that is already known in this country to a person of ordinary skill in the art.

SUMMARY

A color conversion panel according to an embodiment includes a first color conversion layer, a second color conversion layer, and a light wavelength conversion layer positioned on a substrate and representing different colors, wherein the first color conversion layer includes a first semiconductor nanocrystal emitting red light, the second color conversion layer includes a second semiconductor nanocrystal emitting green light, the light wavelength conversion layer includes a third semiconductor nanocrystal emitting green light, and the green light emitted from the third semiconductor nanocrystal and blue light transmitting through the light wavelength conversion layer are combined.

The second semiconductor nanocrystal and the third semiconductor nanocrystal may be the same.

A wavelength of light converted by the second semiconductor nanocrystal to be emitted may be longer than a wavelength of light converted by the third semiconductor nanocrystal to be emitted.

A content of the third semiconductor nanocrystal may be less than about 20 wt % for the entire content of the light wavelength conversion layer.

The wavelength range of the light emitted from the light wavelength conversion layer may be about 455 nm to about 465 nm.

The light wavelength conversion layer may further include at least one of a dye and a pigment.

A blue light cutting filter positioned at at least one of between the first color conversion layer and the substrate and between the second color conversion layer and the substrate may be further included.

A blue color filter positioned between the light wavelength conversion layer and the substrate may be further included.

At least one among the first color conversion layer, the second color conversion layer, and the light wavelength conversion layer may further include a scattering member.

A display device according to an embodiment includes: a lower panel including a thin film transistor; and a color conversion panel overlapping the lower panel, wherein the color conversion panel includes a first color conversion layer, a second color conversion layer, and a light wavelength conversion layer positioned between a substrate and the lower panel, the first color conversion layer includes a first semiconductor nanocrystal emitting red light, the second color conversion layer includes a second semiconductor nanocrystal emitting green light, the light wavelength conversion layer includes a third semiconductor nanocrystal emitting green light, and the green light emitted from the third semiconductor nanocrystal and blue light transmitting through the light wavelength conversion layer are combined.

A light unit positioned at a rear surface of the lower panel may be further included, and a wavelength of the light emitted from the light unit may be about 440 nm to about 450 nm.

An embodiment may be related to a color conversion panel. The color conversion panel may include a first color conversion layer, a second color conversion layer, and a light wavelength conversion layer. The first color conversion layer may include a first semiconductor nanocrystal set for providing red light. The second color conversion layer neighbors the first color conversion layer and may include a second semiconductor nanocrystal set for providing first green light. The light wavelength conversion layer neighbors the second light conversion layer, may provide blue light, and may include a third semiconductor nanocrystal set for providing second green light.

Semiconductor nanocrystals of the second semiconductor nanocrystal set may be identical to semiconductor nanocrystals of the third semiconductor nanocrystal set.

The light wave length conversion layer may receive incident light to produce output light. A wavelength of the output light may be longer than a wavelength of the incident light.

The third semiconductor nanocrystal set may be less than 20 wt % of the light wavelength conversion layer.

The light wave length conversion layer may receive incident light to produce output light. A wavelength of the incident light may be in a range of 440 nm to 450 nm. A wavelength of the output light may be in a range of 455 nm to 465 nm.

The light wavelength conversion layer may include at least one of a dye and a pigment.

The color conversion panel may include a blue light cutting filter positioned between the substrate and at least one of the first color conversion layer and the second color conversion layer.

The color conversion panel may include a blue color filter positioned between the light wavelength conversion layer and the substrate.

At least one of the first color conversion layer, the second color conversion layer, and the light wavelength conversion layer may include a light scattering member.

An embodiment may be related to a display device. The display device may include the following elements: a transistor panel may include a thin film transistor; a first color conversion layer overlapping the transistor panel and including a first semiconductor nanocrystal set for providing red light; a second color conversion layer neighboring the first color conversion layer and including a second semiconductor nanocrystal set for providing first green light; and a light wavelength conversion layer neighboring the second color conversion layer, configured to provide blue light, and including a third semiconductor nanocrystal set for providing second green light.

The display device may include a light unit. The light unit may emit emitted light. The transistor panel may be positioned between the light unit and the light wavelength conversion layer. A wavelength of the emitted light may be in a range of 440 nm to 450 nm.

Semiconductor nanocrystals of the second semiconductor nanocrystal set may be identical to semiconductor nanocrystals of the third semiconductor nanocrystal set.

The first green light may have a first green light wavelength. The second green light may have a second green light wavelength. The second green light wavelength is shorter than the first green light wavelength.

The display device may include a light unit. The light unit may emit emitted light. The light wave length conversion layer may receive the emitted light to produce output light. A wavelength of the output light may be longer than a wavelength of the emitted light.

The third semiconductor nanocrystal set may be less than 20 wt % of the light wavelength conversion layer.

The display device may include a light unit. The light unit may emit emitted light. The light wave length conversion layer may receive the emitted light to produce output light. A wavelength of the output light may be in a range of 455 nm to 465 nm.

The light wavelength conversion layer may include at least one of a dye and a pigment.

The display device may include a blue light cutting filter. At least one of the first color conversion layer and the second color conversion layer may be positioned between the blue light cutting filter and the transistor panel.

The display device may include a blue color filter. The light wavelength conversion layer may be positioned between the blue color filter and the transistor panel.

At least one of the first color conversion layer, the second color conversion layer, and the light wavelength conversion layer may include a light scattering member.

The light wavelength conversion layer may include a blue particle set. Each blue particle of the blue particle set may be smaller than each semiconductor nanocrystal of the third semiconductor nanocrystal set.

According to embodiments, a color conversion panel and/or a display device may have satisfactory color reproducibility and/or satisfactory light emission efficiency.

DETAILED DESCRIPTION OF EMBODIMENTS

Example embodiments are described with reference to the accompanying drawings. As those skilled in the art would realize, the described embodiments may be modified in various ways.

Although the terms "first", "second", etc. may be used herein to describe various elements, these elements, should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

In the drawings and this specification, the same or like constituent elements may be designated by the same reference numerals.

In the drawings, thicknesses of layers and regions may be exaggerated for convenience of description.

When a first element (such as a layer, film, region, or substrate) is referred to as being "on" a second element, the first element can be directly on the second element, or one or more intervening elements may be present between the first element and the second element. In contrast, when a first element is referred to as being "directly on" a second element, there are no intended intervening elements (except for environmental elements such as air) present between the first element and the second element. In the specification, the word "on" or "above" may mean positioned on or below an object, and does not necessarily mean positioned on the upper side of the object based on a gravitational direction.

Unless explicitly described to the contrary, the word "comprise" and variations such as "comprises" or "comprising" may imply the inclusion of stated elements but not exclusion of other elements.

A "semiconductor nanocrystal" may represent a semiconductor nanocrystal set or a set of semiconductor nanocrystals.

Figure 1:
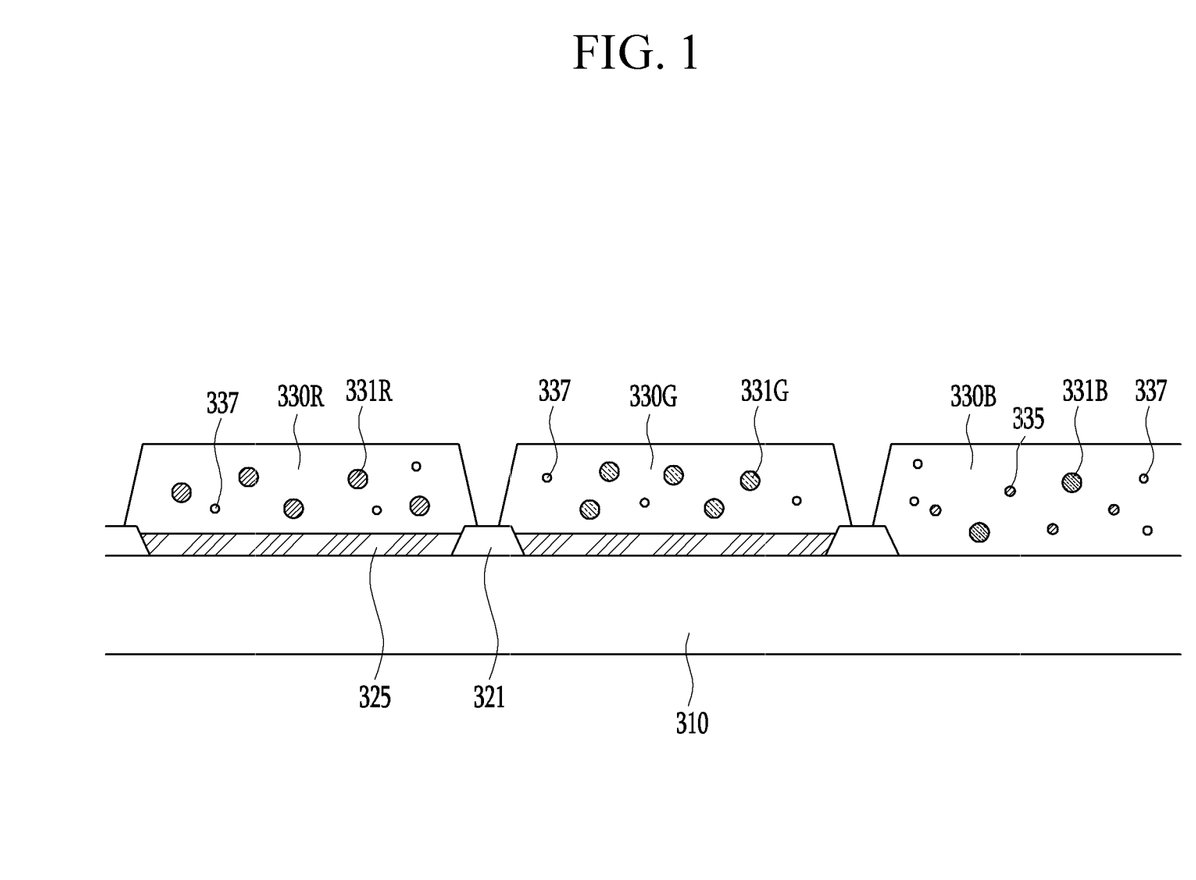
FIG. 1 is a cross-sectional view of a color conversion panel according to an embodiment.

FIG. 1 is a cross-sectional view of a color conversion panel according to an embodiment.

The color conversion panel includes a light blocking member 321 positioned on a substrate 310. A light blocking member 321 may be positioned at each valley formed between a first color conversion layer 330R and a second color conversion layer 330G adjacent in a first direction, between a second color conversion layer 330G and a light wavelength conversion layer 330B adjacent to each other, and between a light wavelength conversion layer 330B and a first color conversion layer 330R adjacent to each other. The light blocking member 321 may define a region where the first color conversion layer 330R, the second color conversion layer 330G, and the light wavelength conversion layer 330B are disposed. In an embodiment, the first color conversion layer 330R, the second color conversion layer 330G, and the light wavelength conversion layer 330B are disposed in a matrix/array; portions of a light blocking member 321 may also be positioned between first color conversion layers 330R adjacent in a second direction perpendicular to the first direction, between adjacent second color conversion layers 330G, and between adjacent light wavelength conversion layers 330B.

A blue light cutting filter 325 is positioned on the substrate 310.

The blue light cutting filter 325 is positioned (or overlaps) a region emitting red and green and is not positioned in (or does not overlap) a region emitting blue. The blue light cutting filter 325 may have an opening exposing the region emitting blue. The blue light cutting filter 325 may include a portion overlapping the first color conversion layer 330R and a portion overlapping the second color conversion layer 330G.

Blue light cutting filters 325 positioned on the substrate 310 may be connected to each other or may be separated from each other.

The blue light cutting filter 325 transmits light having a wavelength not in a blue wavelength band, and blocks light having the blue wavelength band. The blue light cutting filter 325 may include a suitable material to perform the above-described functions. The blue light cutting filter 325 may be a yellow color filter as an example. In an embodiment, the blue light cutting filter 325 may be directly connected to the first color conversion layer 330R and/or the second color conversion layer 330G. In an embodiment, the blue light cutting filter 325 may include a red color filter overlapping the first color conversion layer 330R and a green color filter overlapping the second color conversion layer 330G. In an embodiment, a blue light cutting filter 325 overlapping the first color conversion layer 330R and a blue light cutting filter 325 overlapping the second color conversion layer 330G may be separated from each other.

The color conversion panel according to an embodiment may further include a buffer layer positioned between the blue light cutting filter 325 and the substrate 310.

The first color conversion layer 330R and the second color conversion layer 330G may be positioned on the blue light cutting filter 325 or corresponding blue light cutting filters 325, and the light wavelength conversion layer 330B may be positioned on the substrate 310. First color conversion layers 330R, second color conversion layers 330G, and light wavelength conversion layers 330B may be disposed in a matrix/array and may each have an island shape or a stripe shape.

Each of the first color conversion layer 330R, the second color conversion layer 330G, and the light wavelength conversion layer 330B may emit light having a different wavelength from incident light.

The first color conversion layer 330R may be a red color conversion layer for converting blue light to emit red light. The first color conversion layer 330R may include a first semiconductor nanocrystal (set) 331R for converting the incident blue light into the red light. The first semiconductor nanocrystal 331R may include at least one of a phosphor (set) and a quantum dot (set).

The first semiconductor nanocrystal 331R may include a red phosphor, and the red phosphor may contain one of (Ca, Sr, Ba)S, (Ca, Sr, Ba)$_2$Si$_5$N$_8$, CaAlSiN$_3$, CaMoO$_4$, and Eu$_2$Si$_5$N$_8$.

The second color conversion layer 330G may be a green color conversion layer for converting blue light to emit green light. The second color conversion layer 330G may include a second semiconductor nanocrystal (set) 331G for converting the incident blue light into the green light. The second semiconductor nanocrystal 331G may include at least one of a phosphor set and a quantum dot set.

The second semiconductor nanocrystal 331G may include a green phosphor, and the green phosphor may contain one of yttrium aluminum garnet (YAG), (Ca, Sr, Ba)$_2$SiO$_4$, SrGa2S$_4$, BAM, α-SiAlON, β-SiAlON, Ca$_3$Sc2Si$_3$O$_{12}$, Tb$_3$Al$_5$O$_{12}$, BaSiO$_4$, CaAlSiON, and (Sr(1-x)Bax)Si$_2$O$_2$N$_2$. In an embodiment, the x may be any number between 0 and 1.

The light wavelength conversion layer 330B may include a third semiconductor nanocrystal (set) 331B for converting a first portion of incident blue light into green light. Semiconductor nanocrystals of the third semiconductor nanocrystal (set) 331B may be substantially identical to semiconductor nanocrystals of the second semiconductor nanocrystal (set) 331G. The third semiconductor nanocrystal 331B may include at least one of a green phosphor (set) and a quantum dot (set). The third semiconductor nanocrystal (set) 331B may include fewer semiconductor nanocrystals than the second semiconductor nanocrystal (set) 331G.

The light wavelength conversion layer 330B may emit a second portion of the incident blue light with an unchanged first wavelength. The second portion of the blue light and the green light provided by the third semiconductor nanocrystal (set) 331B may be combined inside or at the light wavelength conversion layer 330B. As a result, the light wavelength conversion layer 330B may provide blue light having a second wavelength unequal to the first wavelength.

The first wavelength of both the incident blue light and the output blue light may be in a range of about 440 nm to about 450 nm, and the wavelength of the output green light resulted from the conversion of the first portion of the incident blue light by the third semiconductor nanocrystal 331B may be in a range of about 530 nm to about 540 nm. The output blue light (having the first wavelength) and the output green light (resulted from the conversion performed by the third semiconductor nanocrystal 331B) are combined such that the light wavelength conversion layer 330B may emit the output blue light having a wavelength in a range of about 455 nm to about 465 nm. The output blue light having a width in such a wavelength range may have excellent color reproducibility.

The third semiconductor nanocrystal set 331B may be less than about 20 wt % of the light wavelength conversion layer 330B. That is, the weight percent of the third semiconductor nanocrystal set 331B in the light wavelength conversion layer 330B may be less than about 20 wt %. If the weight percent of the third semiconductor nanocrystal set 331B in the light wavelength conversion layer 330B is larger than 20 wt %, the output light emitted from the light wavelength conversion layer 330B may not represent blue, or the blue color reproducibility may be reduced.

The light wavelength conversion layer 330B may include at least one of a dye (set) and a pigment (set) 335. The dye and/or pigment 335 may be a blue dye and/or a blue pigment, and the dye and/or pigment 335 may absorb red light and/or green light and may emit blue light, thereby improving color reproducibility. The weight percent of the dye and/or pigment 335 in the light wavelength conversion layer 330B may be in a range of about 1 wt % to about 5 wt %.

The first color conversion layer 330R, the second color conversion layer 330G, and the light wavelength conversion layer 330B may include quantum dots (instead of or alternative to phosphors) for performing color conversion. The quantum dots may include one or more of a Group II-VI compound, a Group III-V compound, a Group IV-VI compound, a Group IV element, and a Group IV compound.

The Group II-VI compound may include one or more of at least a two-element compound (such as at least one of CdSe, CdTe, ZnS, ZnSe, ZnTe, ZnO, HgS, HgSe, HgTe, MgSe, and MgS), at least a three-element compound (such as at least one of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, and MgZnS), and at least a four-element compound (such as at least one of HgZnTeS, CdZnSeS, CdZnSeTe, CdZnSTe, CdHgSeS, CdHgSeTe, CdHgSTe, HgZnSeS, HgZnSeTe, and HgZnSTe). The Group III-V compound may include one or more of at least a two-element compound (such as at least one of GaN, GaP, GaAs, GaSb, AN, AlP, AlAs, AlSb, InN, InP, InAs, and InSb), at least a three-element compound (such as at least one of GaNP, GaNAs, GaNSb, GaPAs, GaPSb, AlNP, AlNAs, AlNSb, AlPAs, AlPSb, InNP, InNAs, InNSb, InPAs, and InPSb), and at least a four-element compound (such as at least one of GaAlNAs, GaAlNSb, GaAlPAs, GaAlPSb, GaInNP, GaInNAs, GaInNSb, GaInPAs, GaInPSb, GaAlNP, InAlNP, InAlNAs, InAlNSb, InAlPAs, and InAlPSb). The Group IV-VI compound may include one or more of at least a two-element compound (such as at least one of SnS, SnSe, SnTe, PbS, PbSe, and PbTe), at least a three-element compound (such as at least one of SnSeS, SnSeTe, SnSTe, PbSeS, PbSeTe, PbSTe, SnPbS, SnPbSe, and SnPbTe), and at least a four-element compound (such as at least one of SnPbSSe, SnPbSeTe, and SnPbSTe). The Group IV element may include Si and/or Ge. The Group IV compound may be/include a two-element compound, such as SiC and/or SiGe.

In an embodiment, the binary compound, the tertiary compound, or the quaternary compound may be particles and may have equal or unequal concentrations. In an embodiment, a core/shell structure in which some quantum dots enclose some other quantum dots may be implemented. An interfacing surface between the core and the shell may have a concentration gradient in which a concentration of an element decreases closer to the center of the particle (or quantum dot).

The quantum dots may have a full width at half maximum (FWHM) of a light-emitting wavelength spectrum of about 45 nm or less, preferably about 40 nm or less, and more preferably about 30 nm or less; in this range, the color purity and/or the color reproducibility may be optimized. Light emitted through these quantum dots may be emitted in many/all directions; therefore, the viewing angle may be maximized.

In embodiments, shapes of the quantum dots are not specifically limited to shapes that are generally used in the related art. In embodiments, a quantum dot may be/include a nanoparticle (having a spherical, pyramidal, multi-arm, or cubic shape), a nanotube, a nanowire, a nanofiber, and/or a planar nanoparticle.

At least one of the first color conversion layer 330R, the second color conversion layer 330G, and the light wavelength conversion layer 330B may further include one or more light scattering members 337. For example, each of the first color conversion layer 330R, the second color conversion layer 330G, and the light wavelength conversion layer 330B may include a light scattering member 337. In an embodiment, the light wavelength conversion layer 330B includes a scattering member 337, and the first color conversion layer 330R and the second color conversion layer 330G may include no light scattering members. The contents and/or structures of the light scattering members 337 included respectively in the first color conversion layer 330R, the second color conversion layer 330G, and the light wavelength conversion layer 330B may be different from each other.

A light scattering member 337 may evenly scatter incident light and may include at least one of $TiO_2$, $ZrO_2$, $Al_2O_3$, $In_2O_3$, ZnO, $SnO_2$, $Sb_2O_3$, and ITO.

The first color conversion layer 330R, the second color conversion layer 330G, and the light wavelength conversion layer 330B may each include a photosensitive resin and may be manufactured by at least a photolithography process. In an embodiment, the first color conversion layer 330R, the second color conversion layer 330G, and the light wavelength conversion layer 330B may be manufactured through at least a printing process and may include materials different from a photosensitive resin.

Figure 2:
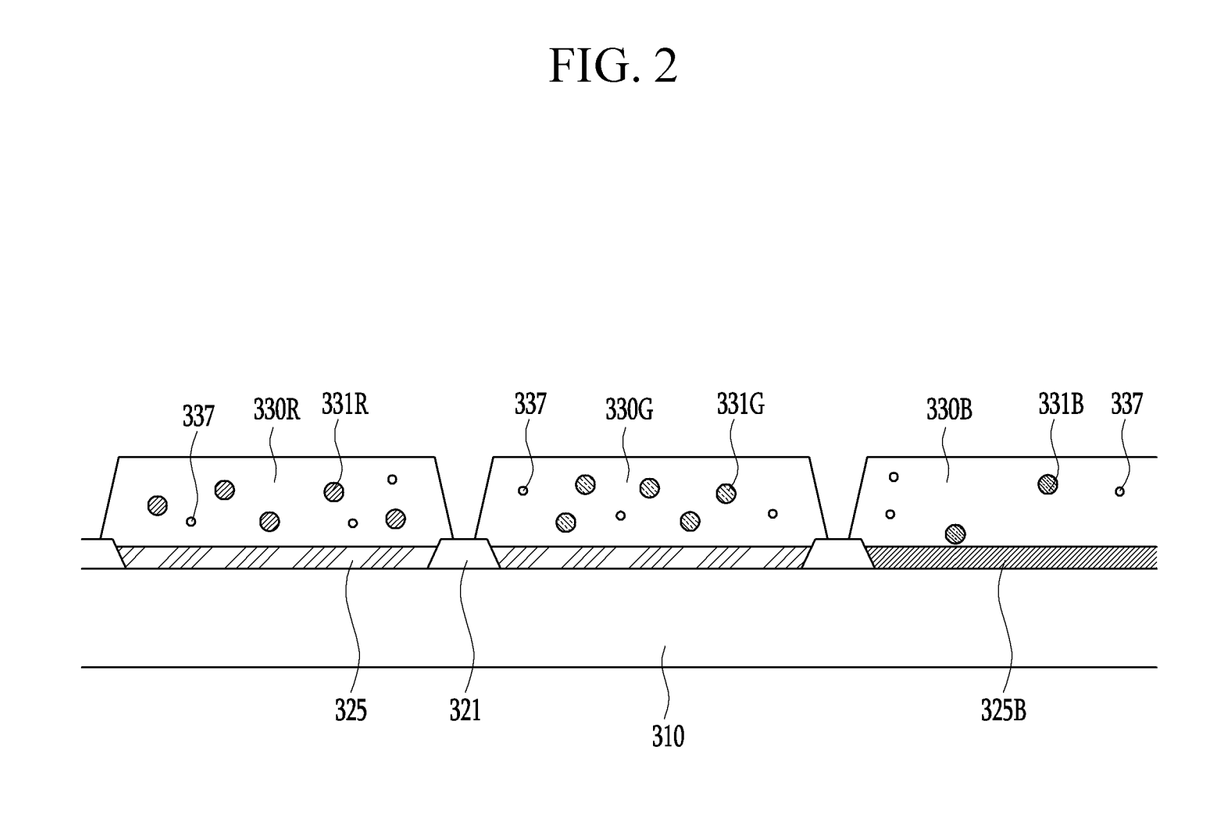
FIG. 2 is a cross-sectional view of a color conversion panel according to an embodiment.
Figure 3:
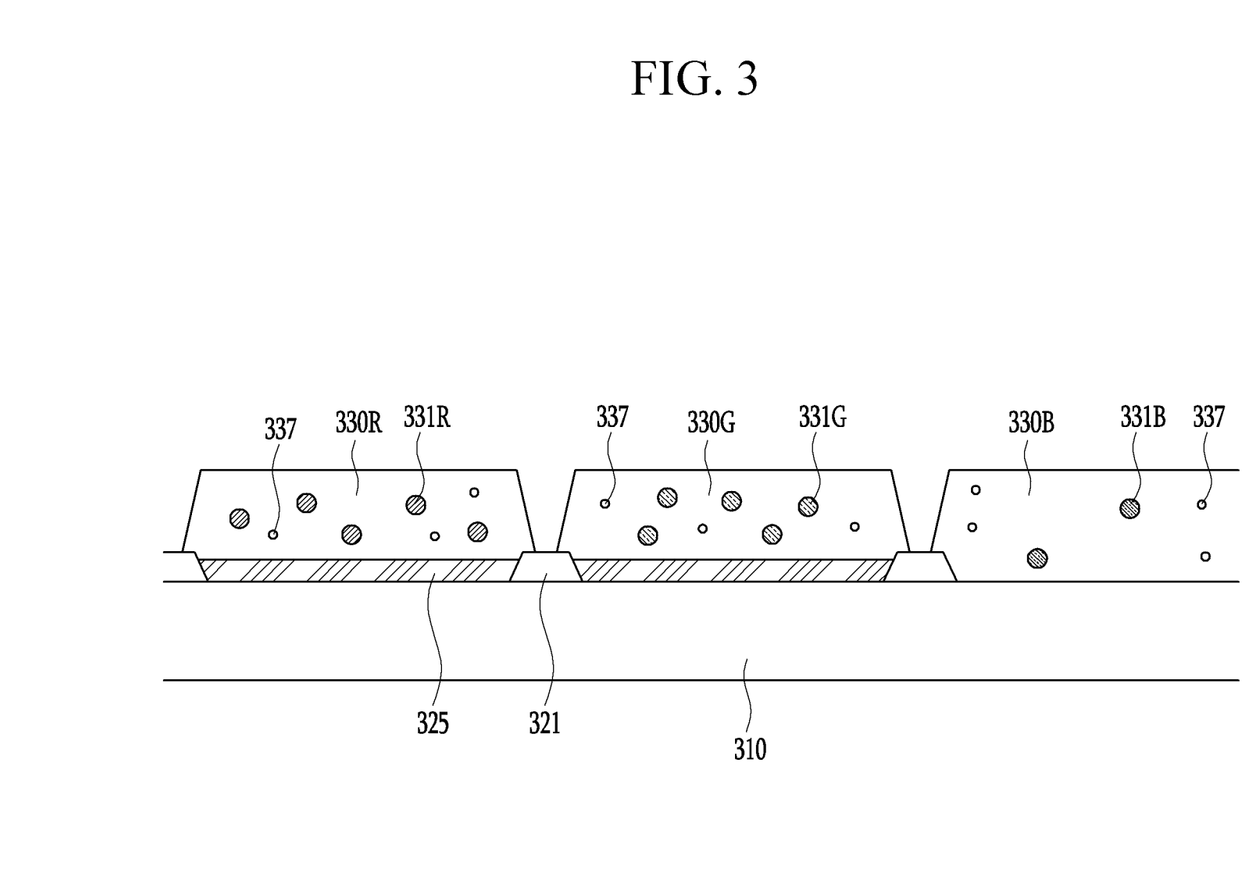
FIG. 3 is cross-sectional view of a color conversion panel according to an embodiment.

FIG. 2 is a cross-sectional view of a color conversion panel according to an embodiment. FIG. 3 is a cross-sectional view of a color conversion panel according to an embodiment. The color conversion panels described with reference to FIG. 2 and FIG. 3 may include structures and/or features that are identical to or analogous to structures and/or features described with reference to FIG. 1.

Referring to FIG. 2, a blue color filter 325B is positioned between a substrate 310 and a light wavelength conversion layer 330B. The blue color filter 325B may reduce external light reflection and/or may improve color reproducibility.

The blue color filter 325B may replace or supplement the dye and/or pigment described with reference to FIG. 1. According to an embodiment illustrated in FIG. 2, the light wavelength conversion layer 330B may not include a dye or a pigment.

The light wavelength conversion layer 330B may include a third semiconductor nanocrystal 331B for converting incident blue light into green light. According to an embodiment, semiconductor nanocrystals of the third semiconductor nanocrystal set 331B may be identical to semiconductor nanocrystals of the second semiconductor nanocrystal set 331G. The third semiconductor nanocrystal 331B may include at least one of the green phosphor and a quantum dot for converting blue light into green light.

The light wavelength conversion layer 330B may receive incident blue light having a first wavelength for providing output blue light having a second wavelength. The first wavelength may be in a range of about 440 nm to about 450 nm, and the second wavelength may in a range of be about 455 nm to about 465 nm. The output blue light emitted from the light wavelength conversion layer 330B may have a longer wavelength than the blue light incident to the light wavelength conversion layer 330B.

The light wavelength conversion layer 330B may emit the output blue light having the second wavelength by combining a first portion of the incident blue light that is emitted as it is with green light resulted from conversion of a second portion of the incident blue light.

In an embodiment, the first wavelength of the incident blue light may be in a range of about 440 nm to about 450 nm, and the wavelength of the green light provided by the third semiconductor nanocrystal 331B may be in a range of about 530 nm to about 540 nm. The first portion of the blue light having the first wavelength and the green light provided by the third semiconductor nanocrystal 331B are combined into the output blue light having a wavelength in a range of about 455 nm to about 465 nm. The output blue light having a wavelength in the wavelength range may have excellent color reproducibility.

The weight percent of the third semiconductor nanocrystal 331B in in the light wavelength conversion layer 330B may be less than about 20 wt % (relative to the entire light wavelength conversion layer 330B). If the weight percent of the third semiconductor nanocrystal 331B is larger than the 20 wt %, the light emitted from the light wavelength conversion layer 330B may not represent blue or the blue color reproducibility may be undesirable.

At least one of the first color conversion layer 330R, the second color conversion layer 330G, and the light wavelength conversion layer 330B may further include one or more light scattering members 337.

Next, referring to FIG. 3, the light wavelength conversion layer 330B may include a third semiconductor nanocrystal set 331B for converting a first portion of incident blue light to emit green light. The third semiconductor nanocrystal 331B may convert blue light having a first wavelength (in a range of about 440 nm to 450 nm) into green light having a third wavelength (about 480 nm to about 520 nm). The third wavelength may be shorter than the wavelength of the light emitted from the second semiconductor nanocrystal 331G. That is, the second semiconductor nanocrystal 331G and the third semiconductor nanocrystal 331B may emit green lights having unequal wavelengths.

The light wavelength conversion layer 330B may emit a second portion of the incident blue light with the first wavelength as it is. The light wavelength conversion layer 330B may emit output blue light having the second wavelength by combining the second portion of the incident blue light and the green light resulted from conversion of the first portion of the incident blue light. In an embodiment, the first wavelength may be in a range of about 440 nm to about 450 nm, and the wavelength of the green light may be in a range of about 480 nm to about 520 nm. The second wavelength may be in a range of about 455 nm to about 465 nm. The output blue light may have excellent color reproducibility.

The weight percent of the third semiconductor nanocrystal 331B may be less than about 20 wt % relative to the entire the light wavelength conversion layer 330B. If the weight percent of the third semiconductor nanocrystal 331B is larger than 20 wt %, the output light may not be blue or the blue color reproducibility may be undesirable.

According to an embodiment, the third semiconductor nanocrystal set 331B may be associated with a shorter wavelength than the second semiconductor nanocrystal 331G, and the light wavelength conversion layer 330B may not include any dye, any pigment, or any additional blue color filter.

At least one of the first color conversion layer 330R, the second color conversion layer 330G, and the light wavelength conversion layer 330B may further include one or more light scattering members 337.

Figure 4:
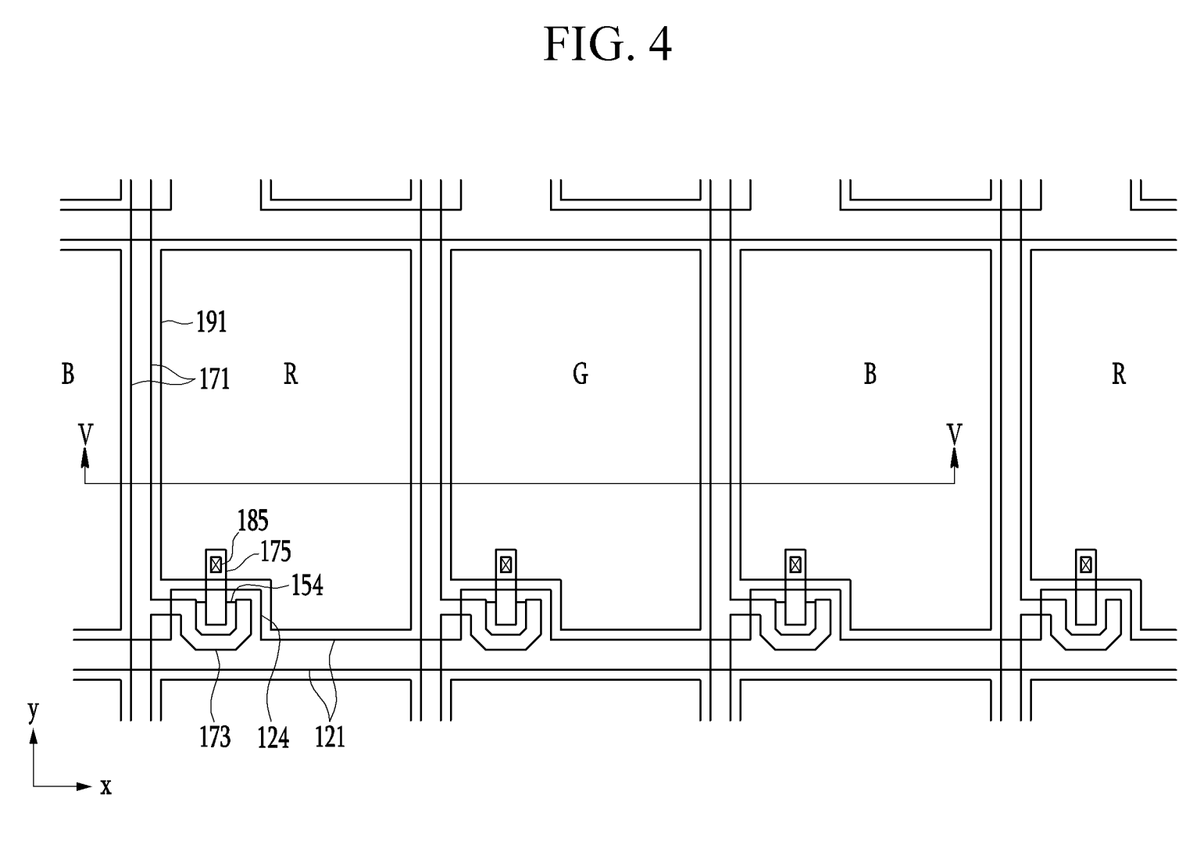
FIG. 4 is a top plan view illustrating a pixel of a display device according to an embodiment.
Figure 5:
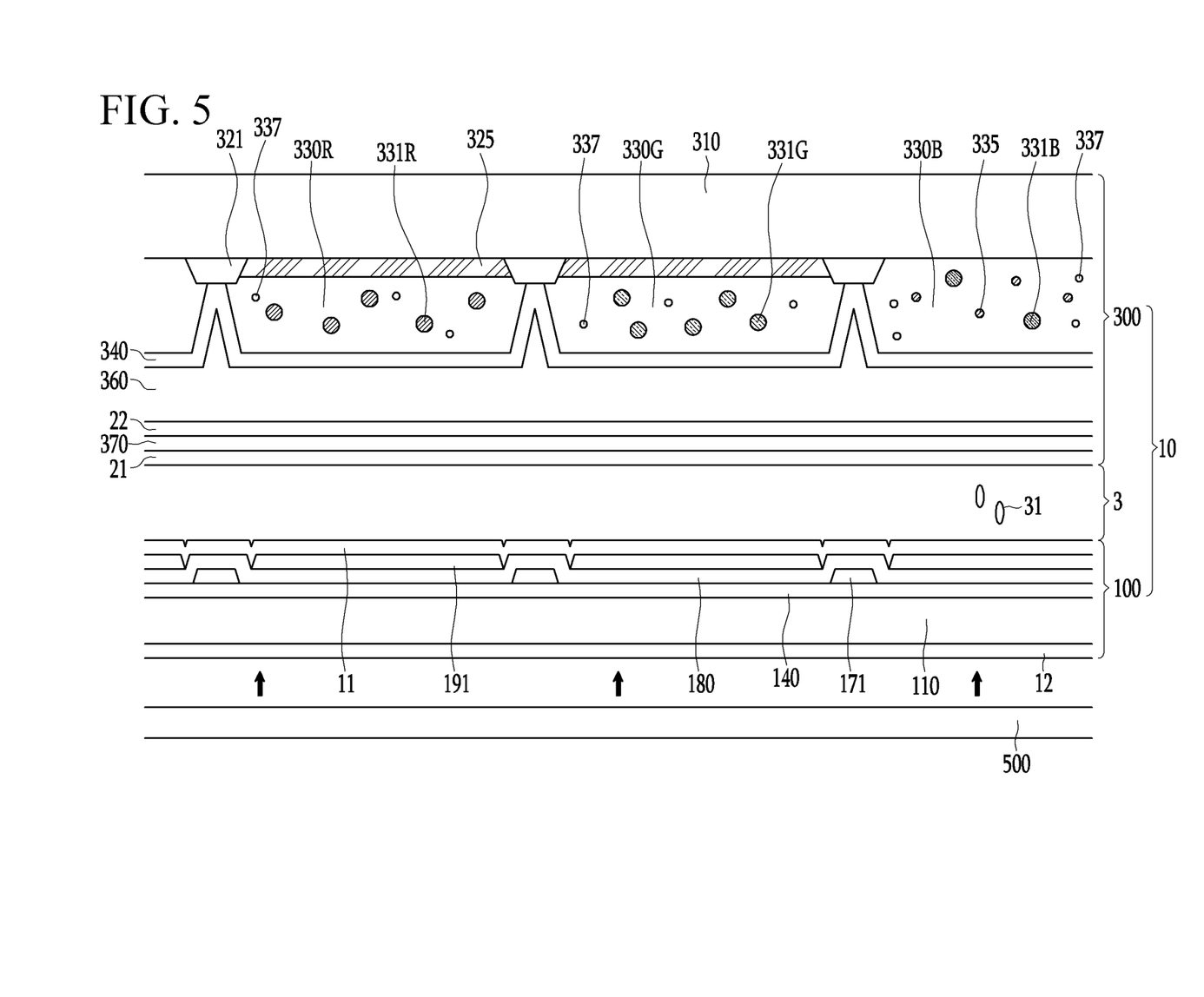
FIG. 5 is a cross-sectional view taken along a line V-V of FIG. 4 according to an embodiment.

FIG. 4 is a top plan view illustrating a pixel of a display device according to an embodiment, and FIG. 5 is a cross-sectional view taken along a line V-V of FIG. 4. The display device may include a color conversion panel that has elements, structure, and/or features identical to or analogous to elements, structure, and/or features of at least one of the color conversion panel discussed with reference to FIG. 1, the color conversion panel discussed with reference to FIG. 2, and the color conversion panel discussed with reference to FIG. 3.

Referring to FIG. 4 and FIG. 5, the display device includes a light unit 500 and a display panel 10 positioned on the light unit 500. The display panel 10 includes a lower panel 100 (or transistor panel 100) including a thin film transistor, a color conversion panel 300 overlapping the lower panel 100, and a liquid crystal layer 3 positioned between the lower panel 100 and the color conversion panel 300.

The light unit 500 may include a light source positioned at a rear surface of the display panel 10 and generating light and may include a light guide receiving the light and guiding the received light in the direction of the display panel 10. In an embodiment, the display panel 10 is an organic light emitting panel, and the light unit 500 may be omitted.

The light unit 500 may include at least one light emitting diode (LED), which may be a blue light emitting diode (LED). The light source may be an edge type of light unit disposed on at least one lateral surface of the light guide (not shown), or a direct type of light unit in which the light source of the light unit 500 is disposed directly under the light guide.

The light emitted from the light unit 500 may have a first wavelength, and the first wavelength may be in a range of about 440 nm to about 450 nm. The first wavelength corresponds to a relatively short wavelength range such that the large excited energy may be provided to the first semiconductor nanocrystal 331R and the second semiconductor nanocrystal 331G. The first color conversion layer 330R and the second color conversion layer 330G to which the light is incident may have desirable light conversion efficiency.

The display panel 10 may include the liquid crystal panel for forming a vertical electric field or a horizontal electric field, a plasma display panel (PDP), an organic light emitting diode display (OLED), a surface conduction electron-emitter display (SED), a field emission display (FED), a vacuum fluorescent display (VFD), or an E-paper. In an embodiment, the display panel 10 may form a vertical electric field.

The lower panel 100 is positioned between the liquid crystal layer 3 and the light unit 500.

The lower panel 100 includes a first polarization layer 12 positioned between a first substrate 110 and the light unit 500. The first polarization layer 12 may polarize the light incident to the light unit 500.

The first polarization layer 12 may be/include one or more of a deposited-type polarizer, a coating-type polarizer, and a wire grid polarizer. The first polarization layer 12 may be positioned at one surface of the first substrate 110 by one or more of various methods such as a film type, a coating type, an adhering type, a printing type, etc.

Pixels are disposed in a matrix/array in the first substrate 110. The first substrate 110 is positioned between the first polarization layer 12 and the liquid crystal layer 3.

A gate line 121 extending in an x direction and including a gate electrode 124, a gate insulating layer 140 positioned between the gate line 121 and the liquid crystal layer 3, a semiconductor layer 154 positioned between the gate insulating layer 140 and the liquid crystal layer 3, a data line 171 positioned between the semiconductor layer 154 and the liquid crystal layer 3, extending in a y direction, and connected to a source electrode 173 and a drain electrode 175, and a passivation layer 180 positioned between the data line 171 and the liquid crystal layer 3 may be formed between the first substrate 110 and the liquid crystal layer 3. A pixel electrode 191 is positioned on the passivation layer 180. The pixel electrode 191 may be physically and electrically connected to the drain electrode 175 through a contact hole 185 included in the passivation layer 180. A first alignment layer 11 may be positioned between the pixel electrode 191 and the liquid crystal layer 3.

The semiconductor layer 154 forms a channel layer at a part that is not covered by the source electrode 173 and the drain electrode 175, and the gate electrode 124, the semiconductor layer 154, the source electrode 173, and the drain electrode 175 form one thin film transistor.

The color conversion panel 300 includes a substrate 310 overlapping the lower panel 100. A light blocking member 321 and a blue light cutting filter 325 are positioned between the substrate 310 and the liquid crystal layer 3.

The blue light cutting filter 325 overlaps the region emitting the red and the green, and is positioned on the substrate 310. The blue light cutting filter 325 may include an opening exposing the region emitting the blue.

A first color conversion layer 330R and a second color conversion layer 330G are respectively positioned between portions of the blue light cutting filter 325 and the liquid crystal layer 3.

The first color conversion layer 330R may be a red color conversion layer. The first color conversion layer 330R may include a first semiconductor nanocrystal set 331R for converting incident blue light into red light.

The second color conversion layer 330G may be a green color conversion layer. The second color conversion layer 330G may include a second semiconductor nanocrystal set 331G for converting incident blue light into green light.

The light wavelength conversion layer 330B may be positioned between the substrate 310 and the liquid crystal layer 3.

The light wavelength conversion layer 330B may include a third semiconductor nanocrystal set 331B converting a first portion of incident blue light into green light. According to an embodiment, semiconductor nanocrystals of the third semiconductor nanocrystal 331B may be identical to semiconductor nanocrystals of the second semiconductor nanocrystal set 331G. The third semiconductor nanocrystal set 331B may include at least one of a green phosphor set and a green quantum dot set for converting blue light into green light.

The light wavelength conversion layer 330B may further include at a dye and/or pigment set 335. The dye/pigment set 335 may include a blue dye and/or a blue pigment for absorbing red light and/or green light to emit blue light, for improving color reproducibility.

At least one of the first color conversion layer 330R, the second color conversion layer 330G, and the light wavelength conversion layer 330B may further include one or more light scattering members 337.

A photo-filter layer 340 may be positioned between the first color conversion layer 330R, the second color conversion layer 330G, and the light wavelength conversion layer 330B, and the liquid crystal layer 3.

The photo-filter layer 340 may be a filter for preventing damage to and/or extinction of the phosphor set or the quantum dot set included in the first color conversion layer 330R, the second color conversion layer 330G, and the light wavelength conversion layer 330B in high temperature processes, for transmitting the light of the predetermined wavelength, and/or for reflecting or absorbing light except for the light of the predetermined wavelength.

The photo-filter layer 340 may include a structure in which inorganic films having a high refractive index and inorganic films having a low refractive index are alternately stacked at least 10 times and at most 20 times. That is, the photo-filter layer 340 may have a structure in which layers having different refractive indexes are stacked. In an embodiment, the photo-filter layer may reflect or absorb light of a specific wavelength. It may transmit and/or reflect light of a specific wavelength using reinforcement interference and/or destructive interference between the inorganic films and the inorganic films.

The photo-filter layer 340 may include at least one of $TiO_2$, $SiN_x$, $SiO_y$, $TiN$, $AlN$, $Al_2O_3$, $SnO_2$, $WO_3$, and $ZrO_2$, and for example, may be a structure in which $SiN_x$ layers and $SiO_y$ layers are alternately stacked. The x and y in $SiN_x$ and $SiO_y$, as factors determining a chemical composition ratio may be controlled depending on process conditions when forming the layers.

An overcoat layer 360 is positioned between the photo-filter layer 340 and the liquid crystal layer 3. The overcoat layer 360 flattens one surface of the first color conversion layer 330R, the second color conversion layer 330G, and the light wavelength conversion layer 330B toward the liquid crystal layer 3.

A second polarization layer 22 is positioned between the overcoat layer 360 and the liquid crystal layer 3. The second polarization layer 22 may be positioned on the flattened surface of the overcoat layer 360.

The second polarization layer 22 may be one or more among the deposited polarization layer, the coated polarization layer, and the wire grid polarization layer, and as one example, the second polarization layer 22 may include a metal pattern wire polarization layer. The second polarization layer 22 may be positioned between the overcoat layer 360 and the liquid crystal layer 3 by various methods such as the film type, the coating type, the adhering type, the printing type, etc. In an embodiment, one surface of the overcoat layer 360, on which the second polarization layer 22 is formed, is flat such that the second polarization layer 22 may be stably formed.

A common electrode 370 is positioned between the second polarization layer 22 and the liquid crystal layer 3. Although not shown in the present specification, when the second polarization layer 22 is a metal material, an insulating layer (not shown) may be additionally positioned between the common electrode 370 and the second polarization layer 22.

The common electrode 370 receiving a common voltage forms an electric field along with the pixel electrode 191, thereby rearranging a plurality of liquid crystal molecules 31 positioned in the liquid crystal layer 3.

A second alignment layer 21 is positioned between the common electrode 370 and the liquid crystal layer 3. The liquid crystal layer 3 includes a plurality of liquid crystal molecules 31, and a movement of the liquid crystal molecules 31 is controlled by the electric field between the pixel electrode 191 and the common electrode 370. Transmittance of light received from the light unit 500 is controlled depending on the movement degree of the liquid crystal molecules 31, for displaying an image. Next, the light conversion efficiency and the color reproducibility of the color conversion panel according to an experimental example and a comparative example are described.

First, as an experimental example, when using light unit having a wavelength of about 445 nm, it is confirmed that the light conversion efficiency of the second semiconductor nanocrystal is about 130%. However, in a case of the comparative example using the light unit having a wavelength of about 458 nm, it may be confirmed that the light conversion efficiency of the second semiconductor nanocrystal is about 100%. That is, in the case of the experimental example according to an embodiment, it may be confirmed that the light conversion efficiency is increased by about 30%.

Next, the color reproducibility of the red color conversion layer is described with reference to Table 1. It is represented that the color reproducibility is better when an X coordinate of the red light is closer to 0.68 and a Y coordinate is closer to 0.32 based on DCI color coordinates.

Experimental Example 1 represents color coordinates of the red color conversion layer including the light unit having a wavelength of about 445 nm, and Experimental Example 2 represents red color coordinates for a case including the light unit having a wavelength of about 445 nm and including the blue light cutting filter. Comparative Example 1 represents red color coordinates for a case of providing the light unit having a wavelength of about 458 nm, and Comparative Example 2 represents red color coordinates for a case of providing the light unit having a wavelength of about 458 nm and providing the blue light cutting filter.

TABLE 1

|  | X coordinate | Y coordinate |
| --- | --- | --- |
| Experimental Example 1 | 0.610 | 0.336 |
| Experimental Example 2 | 0.638 | 0.332 |
| Comparative Example 1 | 0.531 | 0.348 |
| Comparative Example 2 | 0.586 | 0.340 |

Referring to Table 1, in the case of Experimental Examples 1 and 2 compared with Comparative Examples 1 and 2, it is confirmed that the X coordinate is closer to 0.68 and the Y coordinate is closer to 0.32. Accordingly, it is confirmed that the color reproducibility of the red light emitted from the red color conversion layer is improved by changing the wavelength of the light unit.

Additionally, as a result of an experimental example in which the light unit has a 445 nm wavelength and the light wavelength conversion layer includes the second semiconductor nanocrystal or the third semiconductor nanocrystal, it is confirmed that a DCI matching ratio is about 99.4%. However, in a comparative example in which the light unit has a 445 nm wavelength, but the light wavelength conversion layer does not include the semiconductor nanocrystal, it is confirmed that the DCI matching ratio is about 97.7%. This is because the color reproducibility of the blue light according to the comparative example deteriorates in the light wavelength conversion layer region emitting the blue light.

In summary, in the region emitting the red and the region emitting the green, the display device according to an embodiment may provide the blue light having the short wavelength to improve the light conversion efficiency and to improve the color reproducibility. However, when the blue light simply transmits through the light wavelength conversion layer, the color reproducibility of the blue may be reduced. An embodiment may emit the output blue light having a longer wavelength than the incident blue light wavelength. Accordingly, as the color reproducibility is improved in the region emitting the blue, the display device may have improved color reproducibility.

While example embodiments have been described, practical embodiments are not limited to the disclosed embodiment, but are intended to cover various modifications and equivalent arrangements within the spirit and scope of the appended claims.

What is claimed is:

1. A color conversion panel comprising:
a first color conversion layer including a first particle set configured to convert incident blue light to emit red light;
a second color conversion layer neighboring the first color conversion layer and including a second particle set configured to convert the incident blue light to emit green light; and
a light wavelength conversion layer neighboring the second color conversion layer and configured to emit the green light and transmit the incident blue light.

2. The color conversion panel of claim 1, wherein the color conversion panel receives incident light emitted from an organic light emitting panel.

3. The color conversion panel of claim 2, wherein the light wavelength conversion layer is configured to receive the incident blue light from the organic light emitting panel to produce output blue light, and a wavelength of the output blue light is longer than a wavelength of the incident blue light.

4. The color conversion panel of claim 2, wherein the light wavelength conversion layer is configured to receive incident blue light from the organic light emitting panel to produce output blue light, a wavelength of the incident blue light is in a range of 440 nm to 450 nm, and a wavelength of the output blue light is in a range of 455 nm to 465 nm.

5. The color conversion panel of claim 1, wherein the light wavelength conversion layer includes at least one of a dye and a pigment.

6. The color conversion panel of claim 1, further comprising a substrate overlapping each of the first color conversion layer, the second color conversion layer, and the light wavelength conversion layer.

7. The color conversion panel of claim 6, further comprising a blue light cutting filter positioned between the substrate and at least one of the first color conversion layer and the second color conversion layer.

8. The color conversion panel of claim 6, further comprising a blue color filter positioned between the light wavelength conversion layer and the substrate.

9. The color conversion panel of claim 1, wherein at least one of the first color conversion layer, the second color conversion layer, and the light wavelength conversion layer includes a light scattering member.

10. The color conversion panel of claim 1, wherein the light wavelength conversion layer includes a blue particle set configured to provide blue light.

11. The color conversion panel of claim 1, wherein the incident blue light is first blue light, and the light wavelength conversion layer emits second blue light, and a wavelength of the second blue light is longer than a wavelength of the first blue light.

12. A color conversion panel comprising:
a first color conversion layer including a first particle set configured to provide red light;
a second color conversion layer neighboring the first color conversion layer and including a second particle set configured to provide green light; and
a light wavelength conversion layer neighboring the second color conversion layer, configured to provide more blue light than each of the first color conversion layer and the second color conversion layer, and comprising a third particle set configured to provide the green light.

13. The color conversion panel of claim 12, wherein particles of the second particle set are identical to particles of the third particle set.

14. The color conversion panel of claim 12, wherein the third particle set is less than 20 wt % of the light wavelength conversion layer.

15. The color conversion panel of claim 12, wherein the light wavelength conversion layer includes a blue particle set configured to provide blue light, and each blue particle of the blue particle set is smaller than each particle of the third particle set.

16. A color conversion panel comprising:
a first color conversion layer including a first particle set configured to convert first blue light to emit red light;
a second color conversion layer neighboring the first color conversion layer and including a second particle set configured to convert the first blue light to emit green light; and
a light wavelength conversion layer neighboring the second color conversion layer and configured to emit second blue light, wherein a wavelength of the second blue light is longer than a wavelength of the first blue light.

* * * * *